United States Patent [19]
Edagawa et al.

[11] Patent Number: 5,959,764
[45] Date of Patent: Sep. 28, 1999

[54] WAVELENGTH CONVERTER, OPTICALLY OPERATIONAL DEVICE AND OPTICAL PULSE PHASE DETECTING CIRCUIT

[75] Inventors: Noboru Edagawa; Masatoshi Suzuki; Shu Yamamoto, all of Tokyo, Japan

[73] Assignee: Kokusai Denshin Denwa Kabushiki Kaisha, Japan

[21] Appl. No.: 08/923,349

[22] Filed: Sep. 4, 1997

[30] Foreign Application Priority Data

Sep. 4, 1996 [JP] Japan .................................. 8-233796

[51] Int. Cl.$^6$ .......................................................... G02F 1/39
[52] U.S. Cl. ............................................. 359/326; 359/245
[58] Field of Search .................................... 359/326–332, 359/241, 244, 245, 248; 385/1, 2, 4, 5, 8; 372/21, 22, 26, 28

[56] References Cited

U.S. PATENT DOCUMENTS

| | | | |
|---|---|---|---|
| 4,818,898 | 4/1989 | Anderson et al. | 359/328 |
| 5,080,504 | 1/1992 | Partain et al. | 385/17 |
| 5,165,105 | 11/1992 | Haase et al. | 385/8 |
| 5,289,489 | 2/1994 | Bergquist et al. | 372/26 |
| 5,299,170 | 3/1994 | Shibata et al. | 359/326 X |
| 5,402,259 | 3/1995 | Lembo et al. | 359/245 |
| 5,784,188 | 7/1998 | Nakamura et al. | 59/248 |

FOREIGN PATENT DOCUMENTS 0275554   7/1988   European Pat. Off. .
19535772  3/1997   Switzerland .

OTHER PUBLICATIONS

S.J.B. Yoo, Wavelength Conversion Technologies for WDM Network Applications, Jun. 1996, Journal of Lightwave Technology, vol. 14, No. 6, pp. 955–966.

Kurokawa Takashi, Wavelength Converter, Oct. 8, 1993, Patent Abstracts of Japan, Pub.# 05259581.

Iwamura Hidetoshi, Polarization Independent Light Phase Locked Loop Circuit, Aug. 30, 1996, Patent Abstracts of Japan, Pub.# 08220494.

*Primary Examiner*—John D. Lee
*Attorney, Agent, or Firm*—Christie, Parker & Hale, LLP

[57] ABSTRACT

A waveform converter includes a transmission-type InGaAsP electroabsorption optical modulator 10 using the Franz-Keldysh effect. Continuous light (probe light) 12 as a target of wavelength conversion is fed to an end surface 10a of the optical modulator 10 while a constant voltage of 3 V is applied to the optical modulator 10. An optical circulator 14 is supplied with original signal light (signal light to be waveform-converted) 16 through its terminal A, and delivers it from the terminal B thereof to another end surface 10b of the optical modulator 10. The optical modulator 10 gives a loss to the probe light 12 according to the intensity of the original signal light 16 and makes the waveform of the probe light 12 to be substantially the same as the original signal light. The probe light waveform-converted by the optical modulator 10 and output from the end surface 10b is fed to a terminal B of an optical circulator 14 as a waveform-converted light 18 and output from its terminal C.

20 Claims, 12 Drawing Sheets

FIG. 3(1) Original signal light 16
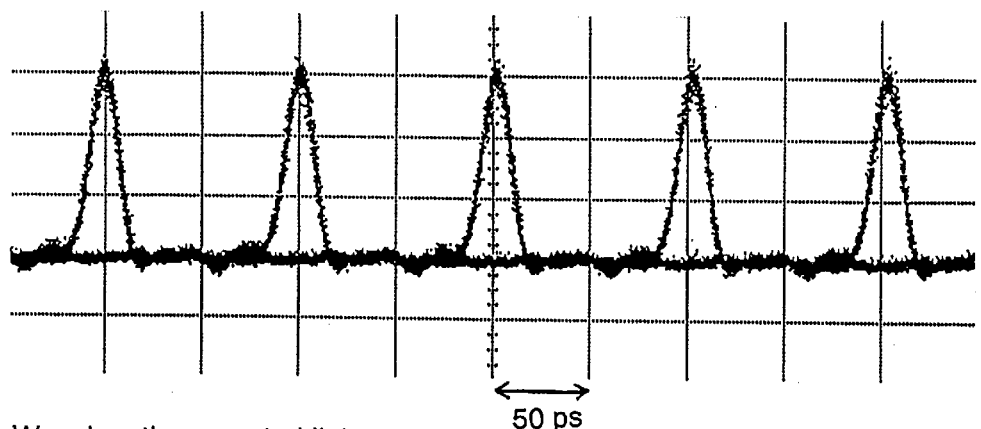
50 ps
FIG. 3(2) Wavelength-converted light 18
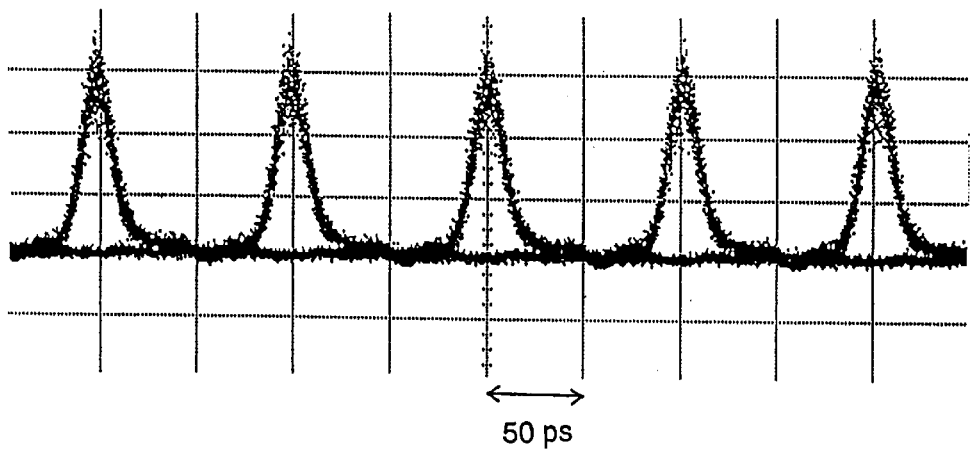
50 ps FIG. 6(1) Probe light 12 (repititive frequency f1)
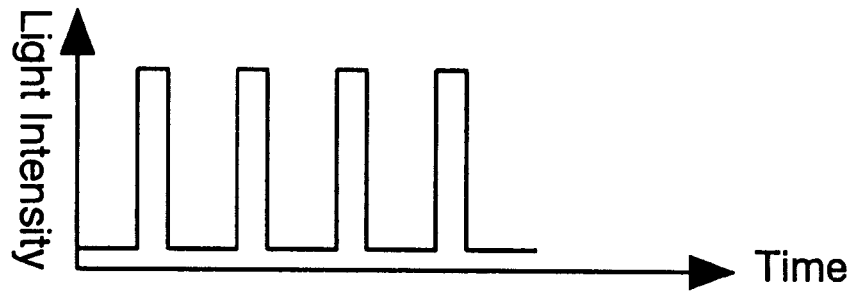
FIG. 6(2) Original signal light 16 (clock frequency f0 = f1)
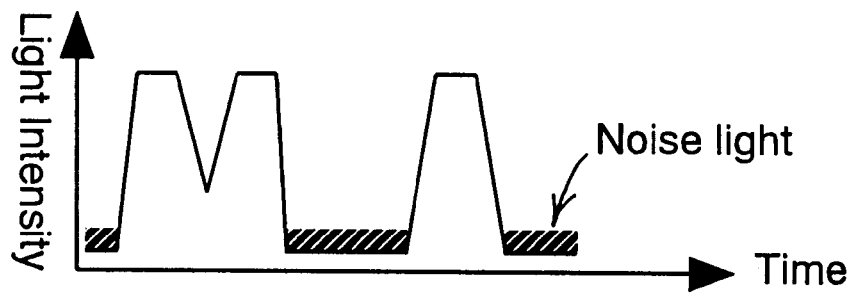
FIG. 6(3) Wavelength-converted light 18
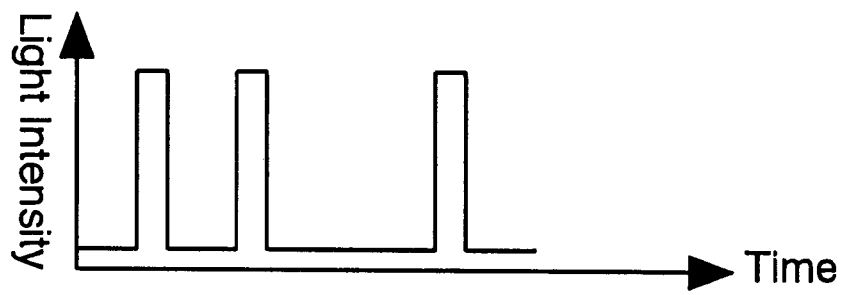

FIG. 7(1) Probe light 12 (repititive frequency f1)
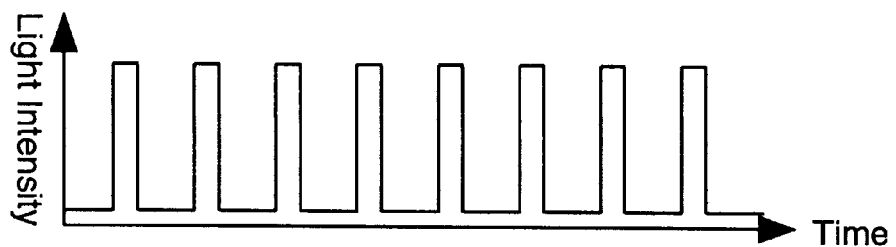
FIG. 7(2) Original signal light 16 (clock frequency f0 < f1)
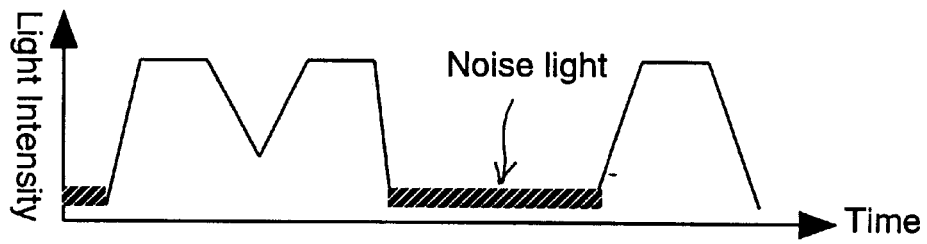
FIG. 7(3) Wavelength-converted light 18
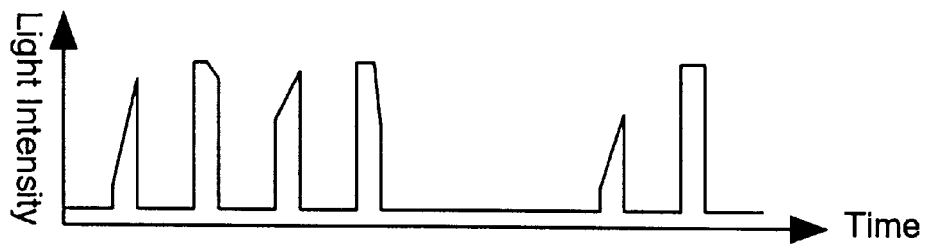

FIG. 8(1) Probe light 12 (repititive frequency f1)
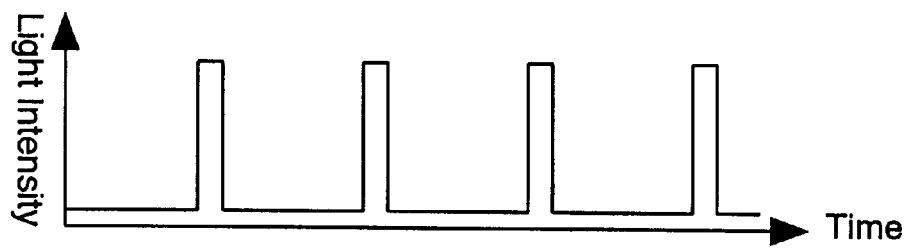
FIG. 8(2) Original signal light 16 (clock frequency f0 = 2 f1)
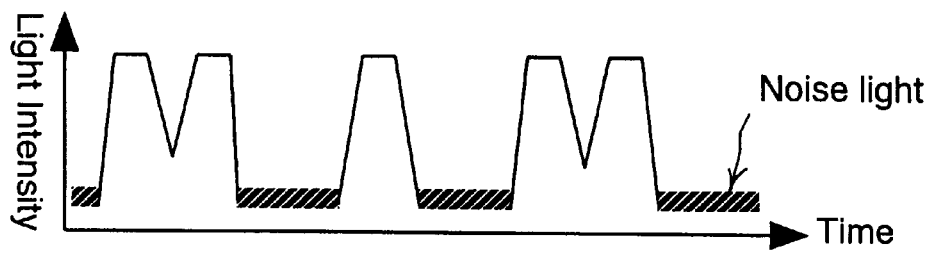
FIG. 8(3) Wavelength-converted light 18
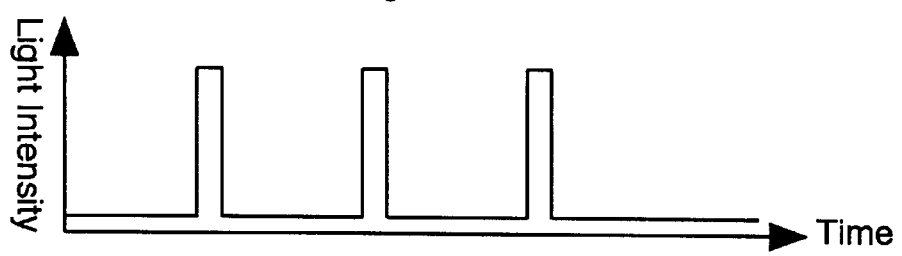

WAVELENGTH CONVERTER, OPTICALLY OPERATIONAL DEVICE AND OPTICAL PULSE PHASE DETECTING CIRCUIT

FIELD OF THE INVENTION

This invention relates to a wavelength converter, optically operational device, and optical pulse phase detecting circuit, and more particularly, to a wavelength converter for converting an optical signal wavelength into another wavelength, an optically operational device for optically operating signal light and probe light, and an optical pulse phase detecting circuit for detecting the pulse phase of a sequence of optical pulses, which are used in optical transmission systems or optical communication systems.

BACKGROUND OF THE INVENTION

Vigorous studies are in progress concerning large-capacity optical communication networks by wavelength-division multiplexed optical signals as an infrastructure supporting the prospective information-oriented society. It has been recognized through the studies that an epoch-making improvement in performance of networks will be possible if signal wavelengths can be converted at nodes of networks.

With this recognition, major research organizations through the world are trying to present practical wavelength converting techniques. Basically, they propose wavelength converters using mutual gain saturation, four-photon mixing or mutual phase modulation of semiconductor laser amplifiers, or using four-photon mixing of optical fibers. FIGS. 11 through 14 are block diagrams showing general constructions of prior devices.

The prior device shown in FIG. 11 uses mutual gain saturation characteristics of a semiconductor laser amplifier. Fed to one end of a semiconductor laser amplifier 110 are intensity-modulated signal light having the wavelength $\lambda 1$ and continuous (CW) light having the wavelength $\lambda 2$. Due to mutual gain saturation characteristics of the semiconductor laser amplifier 110, signal light of wavelength $\lambda 2$ output from the other end of the semiconductor laser amplifier 110 results in intensity-modulated data in which data is inverted in the signal light of wavelength $\lambda 1$.

The prior device shown in FIG. 12 arranges two semiconductor laser amplifiers 112, 114 in form of a Mach-Zehnder interferometer using couplers 116, 118 and 120, and utilizes mutual phase modulation characteristics of the semiconductor laser amplifiers 112 and 114. When a data optical signal of wavelength $\lambda 1$ from the coupler 116 and continuous light of wavelength $\lambda 2$ from the coupler 118 are fed to the Mach-Zehnder interferometer, data optical signal output of wavelength $\lambda 2$, which has been intensity-modulated similarly to the data optical signal of wavelength $\lambda 1$, is obtained from coupler 120.

The prior device shown in FIG. 13 uses four-photon mixing of a semiconductor laser amplifier. When a data optical signal (wavelength $\lambda 1$) and pump light are fed to a semiconductor laser amplifier 122, its output light results in containing satellite light and data optical signal light of wavelength $\lambda 2$ in addition to the data optical signal (wavelength $\lambda 1$) and the pump light, due to four-photon mixing. The data optical signal light of wavelength $\lambda 2$ is a converted light.

The example of FIG. 14 uses a non-linearity of an optical fiber 124 (for example, typical quartz optical fiber) in lieu of the semiconductor laser amplifier 122 of FIG. 12.

Among them, the device shown in FIG. 11 is simplest in construction. However, its extinction ratio of converted light is insufficient and not suitable for multi-stage wavelength conversion.

The device shown in FIG. 12 needs a complicated structure arranging two semiconductor laser amplifiers 112, 114 in form of a Mach-Zehnder interferometer. Moreover, since even a small optical power results in phase modulation of 180 degrees, it invites the problem that small fluctuations in power of the original signal light delicately affect the converted light.

Also the systems shown in FIGS. 13 and 14 using four-photon mixing have following problems. Namely, the arrangement using the semiconductor laser 122 (FIG. 13) has a narrow wavelength band for conversion, and invites a negligible deterioration in S/N ratio by spontaneous emission. The arrangement using the optical fiber 124 (FIG. 14) needs a long optical fiber 124 not less than 1 km, and inevitably causes a large dimension of the device. Moreover, although four-photon mixing theoretically requires that the plane of polarization of the original signal light coincides with that of the pump light, the plane of polarization of signal light travelling through an optical fiber fluctuates on time, and therefore it needs means for removing the fluctuations.

SUMMARY OF THE INVENTION

It is therefore an object of the invention to provide a wavelength converter overcoming the problems involved in the prior devices and promising efficient wavelength conversion, using a simpler construction.

Another object of the invention is to provide a wavelength converter promising a larger extinction ratio.

Another object of the invention is to provide an optically operational device which executes operation of signal light and probe light in the optical stage and can perform waveform shaping, noise suppression and logic operation in the optical stage.

Another object of the invention is to provide an optical pulse phase detecting circuit which can readily detect the phase of a sequence of optical pulses transported by signal light.

In the wavelength converter according to the invention, original signal light and probe light containing at least one wavelength different from the wavelength of the original signal light are fed to an absorptive optical modulator which transmission/absorption characteristics are variable with applied voltage. The probe light output from the absorptive optical modulator has a converted waveform in accordance with the waveform of the original signal light, and is used as output light. Thus, the invention can convert any wavelength with a very simple structure, and need not control the plane of polarization.

When the system uses optical directional coupling means for supplying the original signal light to the absorptive optical modulator and for extracting the probe light waveform-converted by and output from the absorptive optical modulator, both the supply of the original signal light to the absorptive optical modulator and extraction of the waveform-converted probe light from the absorptive optical modulator can be realized with a single optical element, and this also contributes to simplifying the construction.

When the optically amplifying means is provided between the optical directional coupling means and the absorptive optical modulator to amplify at least at least the waveform-converted probe light output from the absorptive optical modulator, a high signal quality of the wavelength-converted light can be maintained even under a cross-talk by the original signal light in the optical directional coupling means.

When a d.c. voltage is used as the voltage applied to the absorptive optical modulator, the peripheral circuit can be simplified.

When a signal is superposed on the applied voltage to the absorptive optical modulator, the signal can be superposed also on the wavelength-converted light. Thus, any appropriate signals may be superposed for various control purposes.

When CW light is used as the probe light, its light source and the peripheral circuit can be simplified. However, when the probe light is repetitive modulated light, then, it can perform a waveform-shaping function and a noise-suppressing function. When the probe light is data-modulated light, the data in the probe light and data in the original signal light can be optically operated and, for example, specific data can be extracted from the original signal light.

When the applied voltage to the absorptive optical modulator contains a signal component having the same frequency as the clock frequency of the original signal light or the probe light, more salient changes in waveform of the probe light can be realized, and more effective waveform-shaping function and noise-suppressing function can be obtained.

The optical operational device according to the invention is configured to feed original signal light and probe light into the light absorptive element which is variable in absorptive characteristics with amount of incident light and applied voltage. Since the transmission/absorption characteristics of the light absorptive element change with intensity of the original signal light, the probe light output from the light absorptive element appears as waveform-converted light in accordance with the waveform of the original signal light.

When the device uses the optical directional coupling means for supplying the original signal light to the light absorptive element and for extracting the waveform-converted probe light output from the light absorptive element, both the supply of the original signal light to the light absorptive element and extraction of the waveform-converted probe light from the absorptive optical modulator can be realized with a single optical element, and this also contributes to simplifying the construction.

When the optically amplifying means is provided between the optical directional coupling means and the light absorptive element to amplify at least the waveform-converted probe light output from the light absorptive element, a high signal quality of the waveform-converted light can be maintained even under a cross-talk by the original signal light in the optical directional coupling means.

When the probe light has a frequency corresponding to a reciprocal of an integer multiple of the clock frequency of the original signal light, an optical signal having the signal waveform of the original signal light or an optical signal resulting from sampling the original signal light in predetermined intervals can be obtained. This results in dividing a time-division multiplexed optical signal on the time base while it takes the form of light.

When the probe light has a wavelength different from that of the original signal light, the wavelength can be converted simultaneously.

The optical pulse phase detecting circuit according to the invention for detecting the optical pulse phase of signal light comprises a laser light source for generating probe light, optical operational means for modifying the intensity of the probe light in accordance with the intensity of the signal light, and photodetective means for detecting the probe light waveform-converted by the optical operational means. Since the signal phase of the signal light can be detected in an optical stage by the optical operational means, the optical PLL circuit, for example can be simplified in construction. The optical operational means, for example, may be the wavelength converter referred to above, or a waveform converter.

DESCRIPTION OF THE DRAWINGS

FIGS. 3(1) and 3(2) are; waveform diagrams of wavelength conversion by the same embodiment;

FIGS. 6(1), 6(2), and 6(3) are; waveform diagrams in case that the clock frequency f0 of original signal light 16 equals f1;

FIGS. 7(1), 7(2), and 7(3) are; waveform diagrams in case of f0<f1;

FIGS. 8(1), 8(2), and 8(3) are; waveform diagrams in case of f1=f0/2;

DETAILED DESCRIPTION OF THE INVENTION

Explained below are embodiments of the invention in detail with reference to the accompanying drawings.

Figure 1:
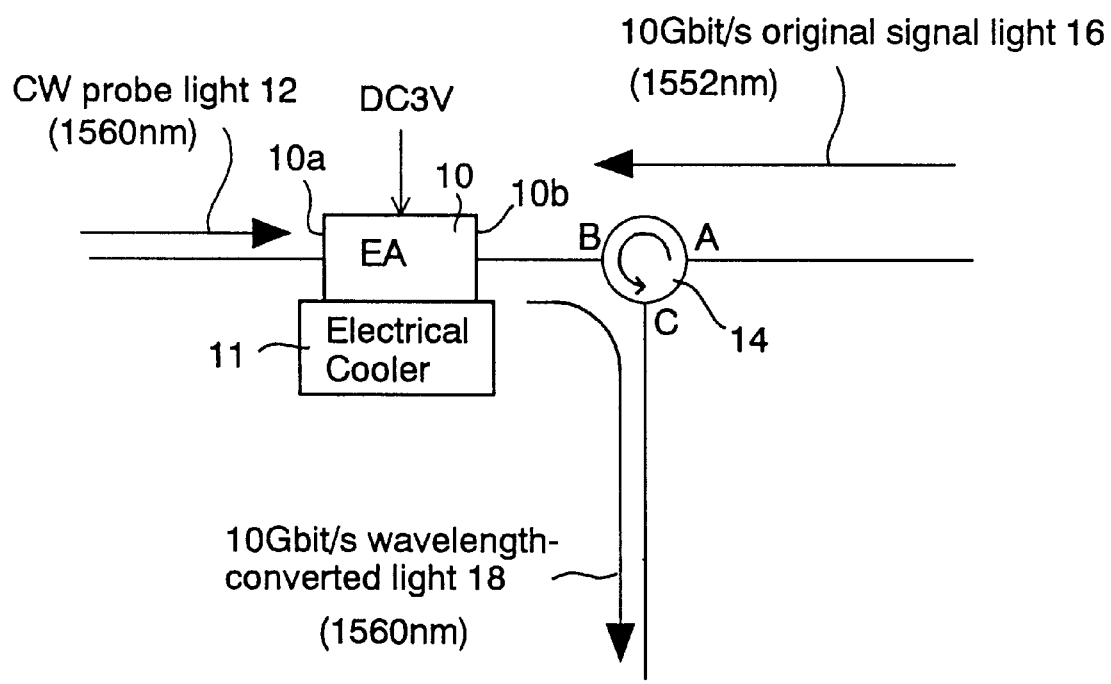
FIG. 1 is a schematic block diagram showing a general construction of a first embodiment of the invention.

FIG. 1 is a schematic block diagram showing a general construction of a first embodiment of the invention. Numeral 10 denotes a waveguide transmission-type InGaAsP electroabsorption optical modulator utilizing Franz-Keldysh effect. Fed to an end surface 10a of the optical modulator 10 is continuous light (probe light) 12 of a target wavelength for wavelength conversion. In this embodiment, the optical modulator 10 is supplied with a constant voltage of 3 v. The optical modulator 10 is supported on an electronic cooling device 11 in form of a piezoelectric element for adjustment to a desired temperature.

Numeral 14 denotes an optical circulator for light entering terminal A to exit from terminal B and for light entering terminal B to exit from terminal C. The optical circulator 14 is supplied with original signal light (signal light to be wavelength-converted) at the terminal A. Connected to the terminal B of the optical circulator 14 is the opposite end surface 10b of the optical modulator 10. As explained later, output light from the terminal C of the optical circulator 14 is wavelength-converted light 18.

In this embodiment, used as the original signal light 16 is signal light having the wavelength of 1,552 nm, which has been RZ-modulated in 10 Gbit/s (marking ratio of 1/2). The probe light 12 is continuous light having the wavelength of 1,560 nm. For the reasons explained later, the converted light 18 is signal light having the wavelength of 1,560 nm and the same data pattern as that of the original signal light 16, that is, 10 G bit/s RZ-modulated signal light (marking ratio of 1/2).

Figure 2:
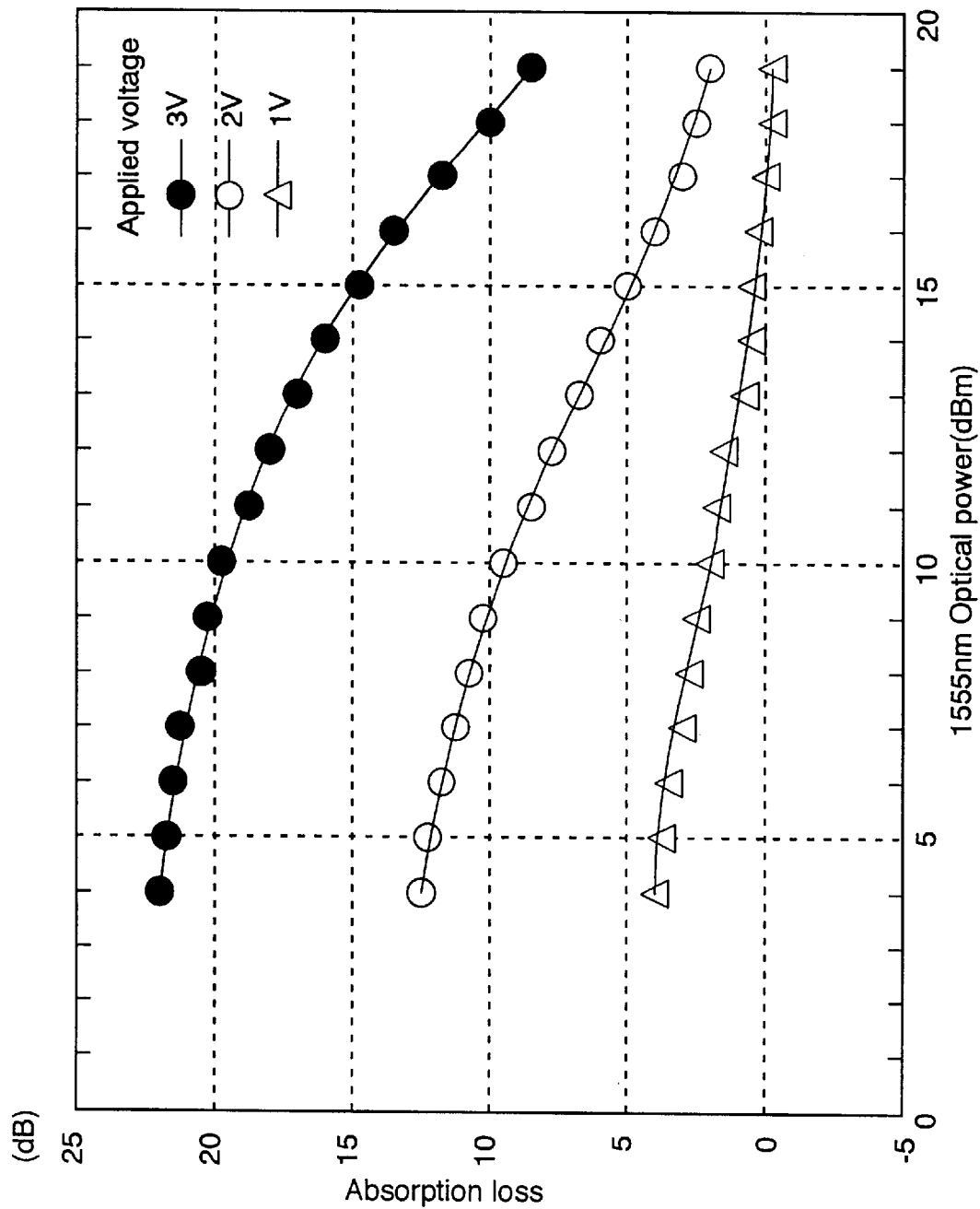
FIG. 2 is a diagram showing absorption loss characteristics of a waveguide electric absorption optical modulator.

The Inventors found that an electroabsorption optical modulator exhibits mutual absorption saturation characteristics when two beams of light different in wavelength are fed. FIG. 2 is a result of an experiment to know how the absorption loss of 1,560 nm light varies with power variation of 1,555 nm light when 1,555 nm light enters into one end of a waveguide transmission-type InGaAsP electroabsorption optical modulator and 1,560 nm light enters into the other end. The power of 1,560 nm light is 4 dBm at the input of the optical modulator. When the voltage applied to the optical modulator is 3 V, absorption loss of light having the wavelength 1,560 nm decreases by 13 dB or more with an increase in optical power of the wavelength 1,555 nm. Due to the absorption loss characteristics, if 1,555 nm light is an intensity-modulated optical signal, 1,560 nm light passing through the optical modulator results in an optical signal which has been intensity-modulated in the same data pattern as that of 1,555 nm light.

In general, the amount of electron-hole pairs generated by absorption within an absorptive optical modulator increases with intensity of incident light. Electron-hole pairs create an internal electric field to cancel the externally applied electric field. Since the internal electric field increases as the level of incident light increases, the absorption coefficient can be changed largely according to the incident light level. In short, the embodiment can be regarded as using an optically modulated signal as the drive source of the absorptive optical modulator, instead of using a modulated applied voltage as its drive source as used in typical methods.

The embodiment performs wavelength conversion by using such mutual absorption saturation characteristics of electroabsorption optical modulators. Although the example of FIG. 2 shifts 5 nm from 1,555 nm to 1,560 nm, the embodiment shown in FIG. 1 shifts 8 nm from 1,552 nm to 1.560 nm. There is no substantial difference between wavelengths 1,555 nm and 1,552 nm for the signal light, and also the embodiment shown in FIG. 1 can expect substantially the same characteristics as shown in FIG. 2.

Explained below are behaviors of the embodiment. The original signal light 16 enters into the end surface 10b of the optical modulator 10 via the terminals A and B of the optical circulator 14, and the probe light 12 enters into the end surface 10a of the optical modulator 10. The average input power of 1,552 nm light (original signal light 16) to the optical modulator 10 is 11 dBm, and that of 1,560 nm light (probe light 12) is 12 dBm. As referred to above, the optical modulator 10 is supplied with the constant voltage of 3 V. While the probe light 12 and the original signal 16 travel in opposite directions within the optical modulator 10, the probe light 12 undergoes attenuation of the same change as the change in intensity of the original signal light 16 as explained with reference to FIG. 2. That is, the data signal of the original signal light 16 is wavelength-converted to the wavelength of the probe light 12. The wavelength-converted probe light, namely the wavelength-converted light 18, enters in the terminal B of the optical circulator 14. Since the optical circulator 14 is an optical element to output incoming light at the terminal B from the terminal C, the converted light 18 with the wavelength 1,560 nm is output from the terminal C. In this manner, the wavelength of 10 Gbit/s RZ-modulated signal light (marking ratio of 1/2) can be converted from 1,552 nm to 1,560 nm.

FIG. 3 shows waveforms by actual wavelength conversion, in which FIG. 3(1) shows a waveform pattern of the original signal light 16 and FIG. 3(2) shows a waveform pattern of the converted light 18. It is known that the data pattern of the 1,552 nm light (original signal light 16) having the waveform of ultrashort optical pulses of approximately 10 ps is faithfully copied to the converted light 18 of the wavelength 1,560 nm. Also, an acceptable extinction ratio is obtained.

Although the embodiment uses a waveguide-type InGaAsP electroabsorption optical modulator using Franz-Keldysh effect, any other absorptive optical modulator can be used provided that it can forcibly discharge electrons and/or holes produced in the optical modulator by absorption to external circuit prior to thermal diffusion by using an electric field generated in the optical modulator by a voltage applied to the optical modulator. For example, a waveguide-type MQW optical modulator using quantum Stark effect of multiquantum wells (MQW) of semiconductors can be used.

Apparently, when an optical circulator is provided in the path for introduction of the probe light 12 into the optical modulator 10, the original signal light 16 passing through the optical modulator 10 can be taken out.

Although the embodiment uses the probe light 12 of a single wavelength, the use of continuous light including a plurality of wavelengths has been experimentally confirmed to realize wavelength conversion into a plurality of wavelengths. The wavelength-converted light 18 has the form of wavelength-division multiplexed light of optical signals of different wavelengths contained in the probe light 12 and having the same data pattern as that of the original signal light 16. For all wavelengths, acceptable waveforms could be obtained.

The embodiment is configured that the probe light 12 and the original signal light 16 travel in the opposite directions within the optical modulator 10. Also when they travel in the same direction, similar wavelength conversion is attained. However, a pattern effect appears in the wavelength-converted light, depending on characteristics of the absorptive optical modulator, and it is difficult to obtain acceptable waveforms as shown in FIG. 3. Although the embodiment uses a transmission-type electroabsorption optical modulator, a different optical modulator can be used. For example, by using a reflective electroabsorption optical modulator having one end surface with a higher reflectance than the other and by making the original signal light and the probe light to travel in opposite directions in the optical modulator, similar effects can be obtained due to mutual absorption saturation characteristics between the original signal light and the probe light.

As explained above, the embodiment can use any typical electroabsorption optical modulator in its original form.

Basically, therefore, it need not use elements with complicated structures or special semiconductor crystals. As a result, simple, high-quality, highly-reliable and inexpensive wavelength converters and optically operational devices can be realized. Moreover, since the embodiment is configured to once convert the original signal light to electron-hole pairs and then convert its optical intensity information alone to wavelength-converted light, it results in the additional advantage that optical phase distortion contained in the original signal is not converted to wavelength-converted light.

The embodiment uses the optical circulator 14 to feed the original signal light 16 to the end surface 10b of the optical modulator 10 and to take out the data-modulated probe light emitted from the end surface 10b. However, the same function can be realized by using another appropriate dividing/multiplexing device such as WDM coupler or 3 dB coupler. That is, any optical element may be used, which can feed the externally introduced original signal light 16 to the end surface 10b of the optical modulator 10 and can take out the wavelength-converted light 18 output from the end surface 10b separately from the original signal light 16.

The embodiment has been illustrated as using a DC voltage as the voltage applied to the optical modulator 10. However, by superposing signals on the applied voltage, it is possible to superpose system monitoring signals on the converted light 18 and to add a sampling function, waveform-shaping function and noise-suppressing function as explained later. Especially when a repetitive signal in the same frequency as the clock frequency of the original signal light 16 is superposed to the applied voltage, the signal modifies the absorptive characteristics of the optical modulator 10, and therefore the extinction ratio of the wavelength-converted light 18 is further improved.

Absorption wavelength characteristics of electroabsorption optical modulators, in general, can be controlled by changing their temperatures. Therefore, also the embodiment shown in FIG. 1 can realize satisfactory waveform-conversion characteristics over a wide wavelength range by appropriately controlling the temperature of the optical modulator 10 by the electronic cooling device 11.

Figure 4:
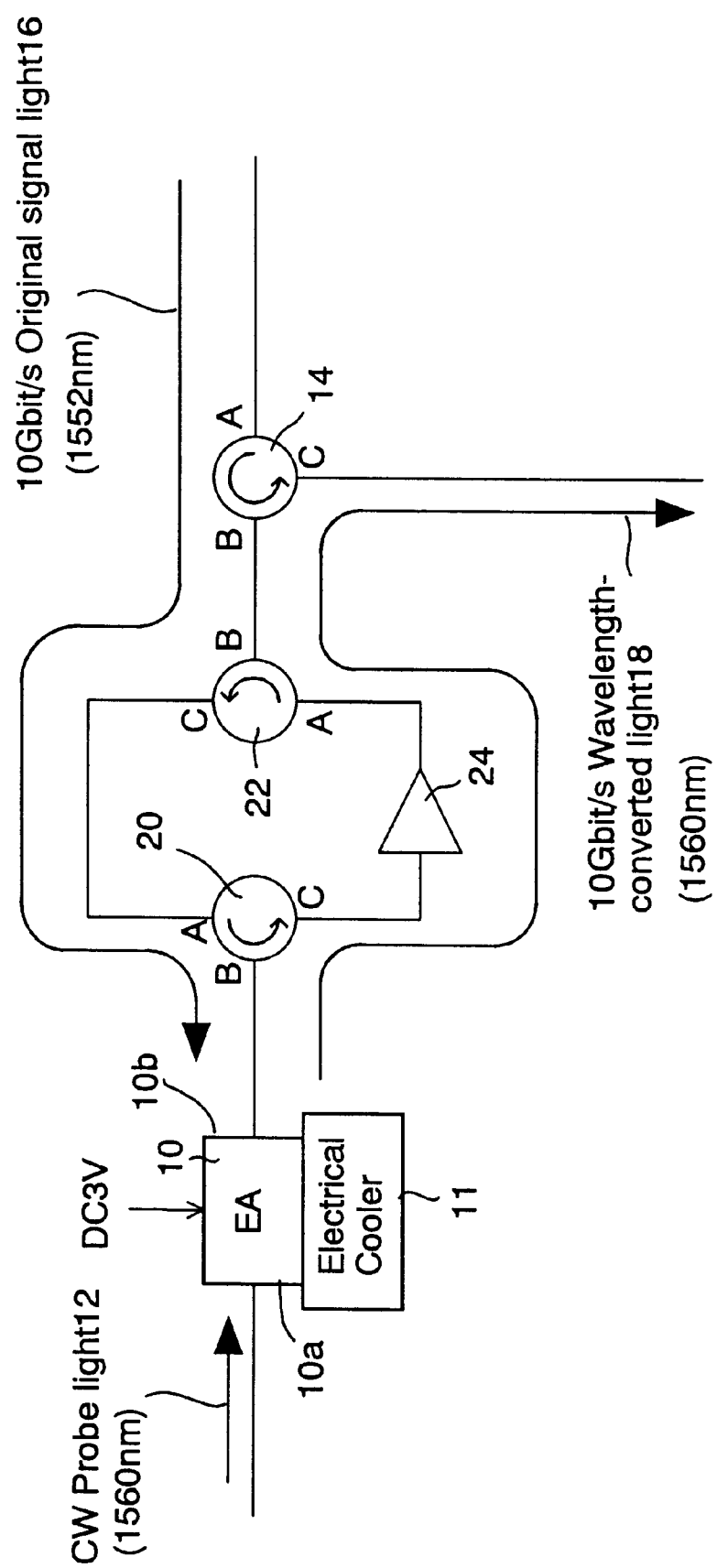
FIG. 4 is a schematic block diagram showing a general construction of another embodiment of the invention.

FIG. 4 is a schematic block diagram showing a general construction of a modified version of the embodiment shown in FIG. 1. This arrangement inserts two optical circulators 20, 22 and optical amplifier 24 between the optical modulator 10 and the optical circulator 14 to selectively amplify output light of the probe light 12 data-modulated in the optical modulator 10 and output from it.

More specifically, the end surface 10b of the optical modulator 10 is connected to terminal B of the optical circulator 20, and terminal C of the optical circulator 20 is connected to the input of the optical amplifier 24. Output of the optical amplifier 24 is connected to terminal A of the optical circulator 14, terminal B of the optical circulator 22 is connected to terminal B of the optical circulator 14, and terminal C of the optical circulator 22 is connected to terminal A of the optical circulator 20.

The original signal light 16 is fed to terminal A of the optical circulator 14, next from terminal B thereof to terminal B of the optical circulator 22, next from terminal C of the optical circulator 22 to terminal A of the optical circulator 20, and further from terminal B of the optical circulator 20 to the end surface 10b of the optical modulator 10. Fed to the end surface 10a of the optical modulator 10 is the probe light 12 which is continuous light like that of the embodiment shown in FIG. 1. Similarly to the embodiment shown in FIG. 1, the optical modulator 10 attenuates the probe light 12 in accordance with the original signal light 16 from the end surface 10b. As a result, the probe light 12 having the same aspect of changes in intensity as that of the original signal light 16, namely the wavelength-converted light 18, is output from the end surface 10b to the terminal B of the optical circulator 20.

The wavelength-converted light 18 input to the terminal B of the optical circulator 20 is supplied from the terminal C to the optical amplifier 24, optically amplified there, and applied to the terminal A of the optical circulator 22. The light input to the terminal A of the optical circulator 22 is delivered from the terminal B to the terminal B of the optical circulator 14, and output from the terminal C of the optical circulator 14.

In this manner, in the modified embodiment shown in FIG. 4, the wavelength-converted light 18 after wavelength conversion by the optical modulator 12 is optically amplified by the optical amplifier 24, and then supplied to the next stage.

For example, in the embodiment of FIG. 1, if the original signal light 16 input to the terminal A of the optical circulator 14 leaks to the terminal C, it is necessary to filter out only the wavelength-converted light 18 from output light at the terminal C of the optical circulator 14. In the modified embodiment of FIG. 4, however, since the wavelength-converted light 18 is amplified by the optical amplifier 24, even when the original signal light 16 input to the terminal A of optical circulator 14 leaks to the terminal C, the leak component of the original signal light 16 need not be removed from output light at the terminal C of the optical circulator 14 and it is possible to reduce signal deterioration of the wavelength-converted light 18 caused by cross-talk.

In the modified embodiment shown in FIG. 4, only the wavelength-converted light 18 is optically amplified by the optical amplifier 24. However, an additional optical amplifier may be provided between the terminal C of the optical circulator 22 and the terminal A of the optical circulator 20 to optically amplify the original signal light 16 appropriately.

In the embodiments shown in FIGS. 1 and 4, the probe light 12 need not be CW light. If the probe light 12 is modulated, for example, the wavelength-converted light 18 has the waveform resulting from intensity modulation of the probe light 12 by the waveform of the original signal light 16. That is, the waveform of the wavelength-converted light 18 corresponds to one obtained by multiplying (logic product) the original signal light 16 and the probe light 12.

Figure 5:
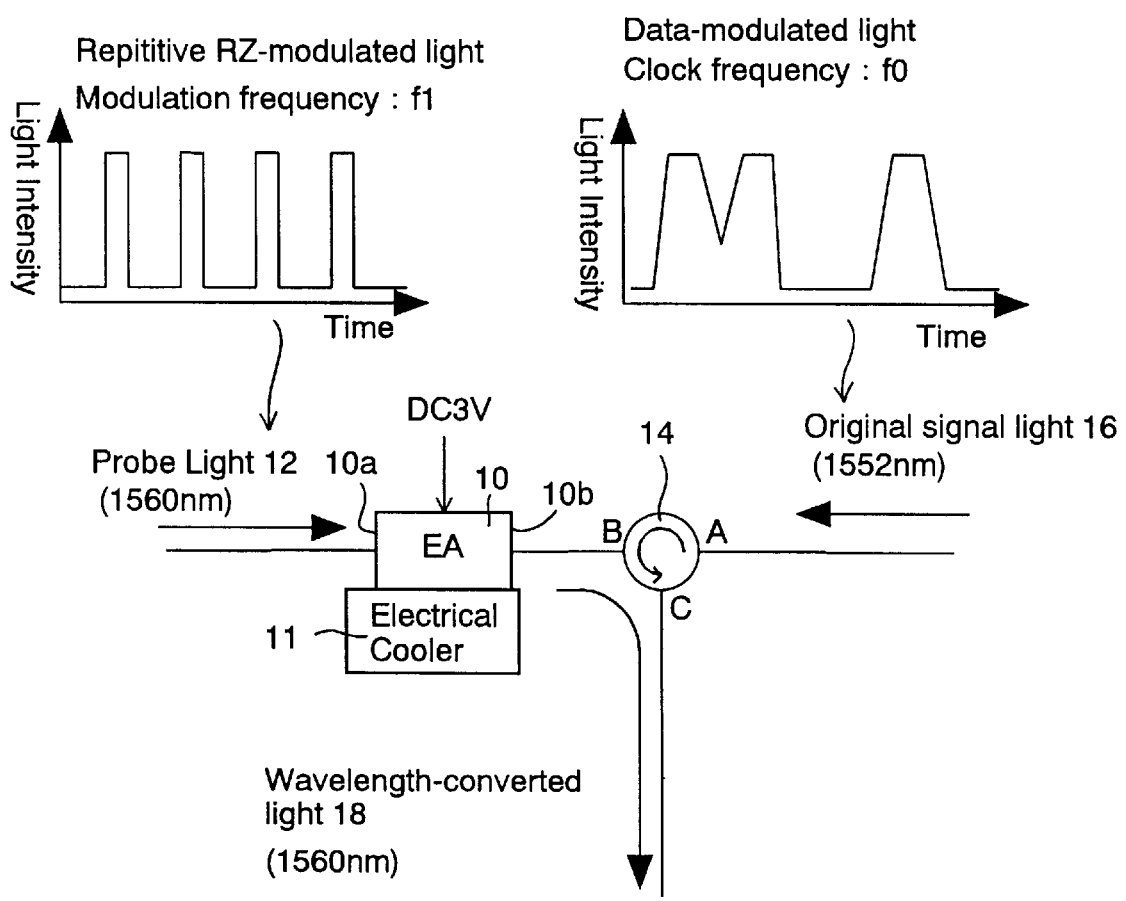
FIG. 5 is a diagram showing a practical example using the embodiment, in which probe light 12 is RZ-modulated by repeat frequency f1.

In the example shown in FIG. 5 where the probe light 12 is RZ-modulated by a repetitive frequency f1, the waveform of the wavelength-converted light 18 has a form obtained by sampling the original signal light 16 by the repetitive frequency f1. Even when the original signal light 16 contains noise light, the level of the noise light in the original signal light 16 is greatly suppressed in the wavelength-converted light 18. That is, waveform shaping function and noise suppressing function can be realized in the optical stage. This is derived from the use of the absorptive optical modulator 10 promising sufficiently large changes in absorption loss relative to the optical power of the original signal light as shown in FIG. 2.

Even when the voltage applied to the optical modulator 10 is a pulsating voltage such as probe light 12, sampling and waveform-shaping of the original signal light 16 and suppression of noise can be attained similarly. In general, however, modulation of the probe light 12 is more effective and convenient because, by increasing the input power of the probe light, the output power can be increased, and distortion in optical phase contained in the original signal light can be removed.

When the original signal light 16 is intensity-modulated light of clock frequency f0 in the arrangement of FIG. 5, the waveform of the wavelength-converted light 18 appears as shown in FIGS. 6, 7 and 8, depending on relations between f0 and f1. FIG. 6 shows a timing diagram when f0=f1, FIG. 7 shows another when f0<f1, and FIG. 8 shows another when the repetitive frequency f1 of the probe light 12 is one half the clock frequency f0 of the original signal light 16, that is, f1=f0/2. In FIGS. 6, 7 and 8, (1) is the waveform of the probe light 12, (2) is the waveform of the original signal light 16, and (3) is the waveform of the wavelength-converted light 18.

In FIG. 6 where f0=f1, the waveform of the wavelength-converted light 18 varies depending on the relationship between the entry timing of the probe light 12 into the optical modulator 10 and the entry timing of the original signal light 16 into the optical modulator 10. Therefore, the entry timing of the probe signal 12 into the optical modulator 10 can be locked with the entry timing of the original signal light 16 into the optical modulator 10 by adjusting the entry timing of the probe light 12 into the optical modulator 10 by referring to the waveform of the wavelength-converted light 18, namely the average intensity (or peak intensity), so as to maximize the average intensity of the wavelength-converted light 18. When f0 is not equal to f1 (FIGS. 7 and 8), the waveform of the wavelength-converted light 18 may be regarded as having been intensity-modulated at the differential frequency between f0 and f1. Using these natures, an optical PLL (phase-locked loop) circuit can be made by detecting the average level of the wavelength-converted light 18 and by controlling the modulation frequency of the probe light 12 to maximize the detected level.

Figure 9:
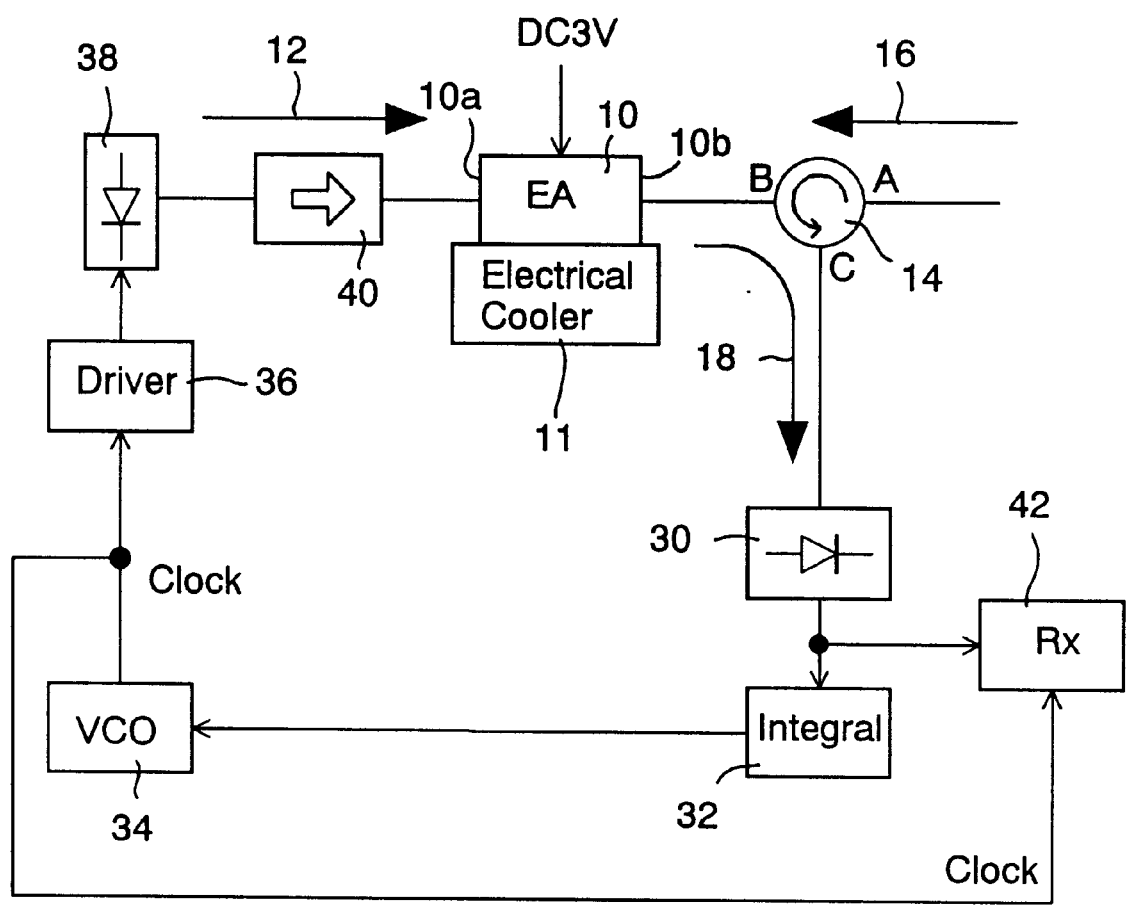
FIG. 9 is a schematic block diagram showing a general construction of an optical PLL circuit using the embodiment shown in FIG. 1.

FIG. 9 is a schematic block diagram showing a general construction of an optical PLL circuit made by using the embodiment shown in FIG. 1. Identical or equivalent elements are labelled with reference numerals common to those in FIG. 1. A photodetective element 30 converts the wavelength-converted light 18 into an electric signal, and an integrating circuit 32 integrates or smoothes the output of the photodetective element 30. A voltage controlled oscillator 34 oscillates in a frequency responsive to the output voltage of the integrating circuit 32, and its output is applied to a laser drive circuit 36. The laser drive circuit 36 drives a semiconductor laser 38 in the output frequency of the oscillator 34 (for example, pulse driving or sinusoidal modulation driving) to emit laser light of a desired waveform. Output light of the semiconductor laser 38 is used as the probe light 12 and applied to the optical modulator 10.

In order to prevent that the original signal light 16 passing through the optical modulator 10 and output from the end surface 10a enters the semiconductor laser 38 and gives an adverse affection, an optical isolator 40 may be provided between the semiconductor laser 38 and the end surface 10a of the optical modulator 10 to absorb the original signal light 16, if any, output from the end surface 10a of the optical modulator 10. From the same standpoint, an optical filter is preferably provided just before the photodetective element 30 to remove or suppress any wavelength light other than the wavelength-converted light 18.

A receiver circuit 42 demodulates data from output signals of the photodetective element 30 in accordance with the output clock of the voltage controlled oscillator 34.

When the original signal light 16 is transmitted over a long distance through optical fiber transmission lines, noise light accumulates therein, and prior systems remove it in the electric stage. In the arrangement of FIG. 9 (or FIG. 5), when the probe light 12 is RZ-modulated light in the same frequency as the clock frequency f1 of the original signal light 16 and fully synchronizes with the original signal light 16, then the wavelength-converted light 18 is light obtained by decoding the data signal transported by the original signal light 16 and suppressing the accumulated noise. This is because respective pulse waveforms of the wavelength-converted light 18 depend on respective pulse waveforms of the probe light 12. The embodiment shown in FIG. 9 has both a waveform-shaping function and a noise suppressing function.

In the examples of FIGS. 5 to 8, the probe light 12 is in form of a repeat RZ signal. Apparently, however, a cosine-square waveform or any other modulated waveform, such as data-modulated RZ- or NRZ-modulated light, is acceptable for optical PLL.

In FIG. 5, when the repetitive frequency f1 of the probe light 12 is a reciprocal of an integer multiple of the clock frequency f0 of the original signal light 16, the waveform of the wavelength-converted light 18 is one obtained by dividing the original signal light 16 on the time base. That is, the time-division multiplexed optical signal can be demultiplexed on the time base in the form of optical signal. As shown in FIG. 2, the electroabsorption optical modulator 10 changes in absorptive characteristics with applied voltage. While the applied voltage is low, the absorption loss of the probe light exhibits relatively flat changes with power change of the original signal light. However, when the applied voltage is high, the absorption loss of the probe light exhibits relatively keen changes with power change of the original signal light. Using these natures, the time-base division function of the time-division multiplexed optical signal can be increased by adjusting the applied voltage of the optical modulator 10 in synchronism with the repetitive frequency of the probe light 12. In short, noise can be suppressed significantly.

Figure 10:
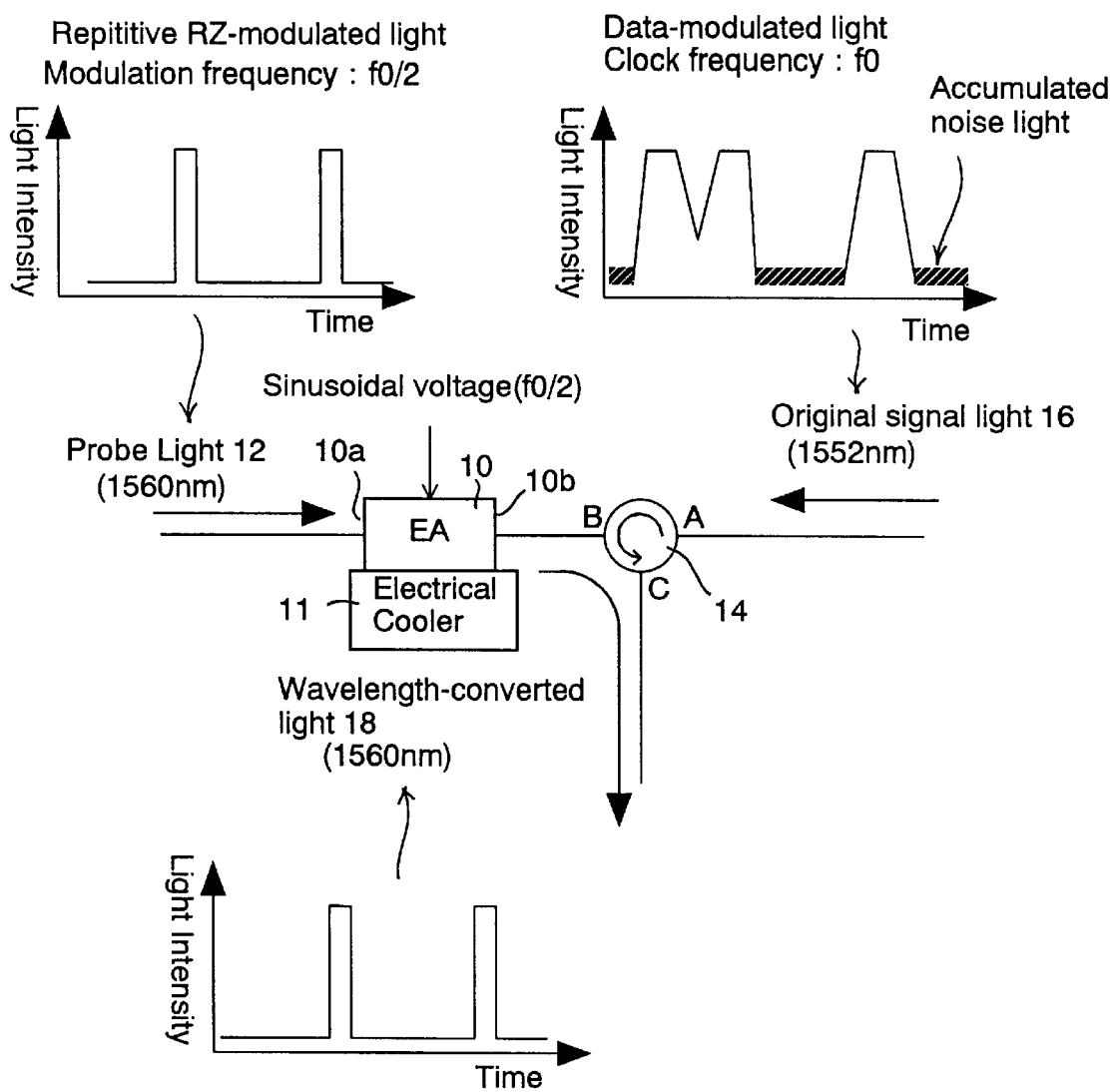
FIG. 10 is a diagram showing a practical example in which a voltage applied to an optical modulator 10 is modulated to reinforce the noise suppression function.
Figure 11:
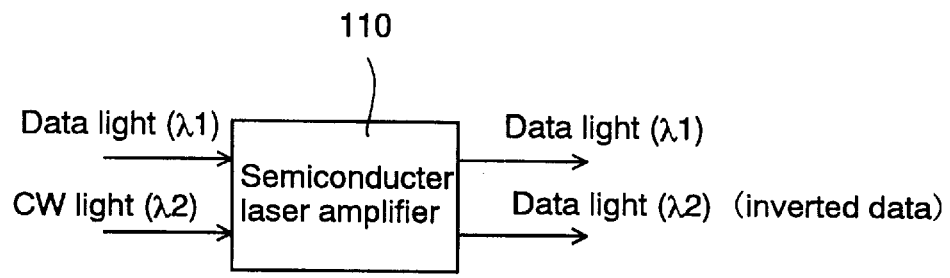
FIG. 11 is a diagram for schematically explaining a prior wavelength converter using mutual gain saturation characteristics of a semiconductor laser amplifier.
Figure 12:
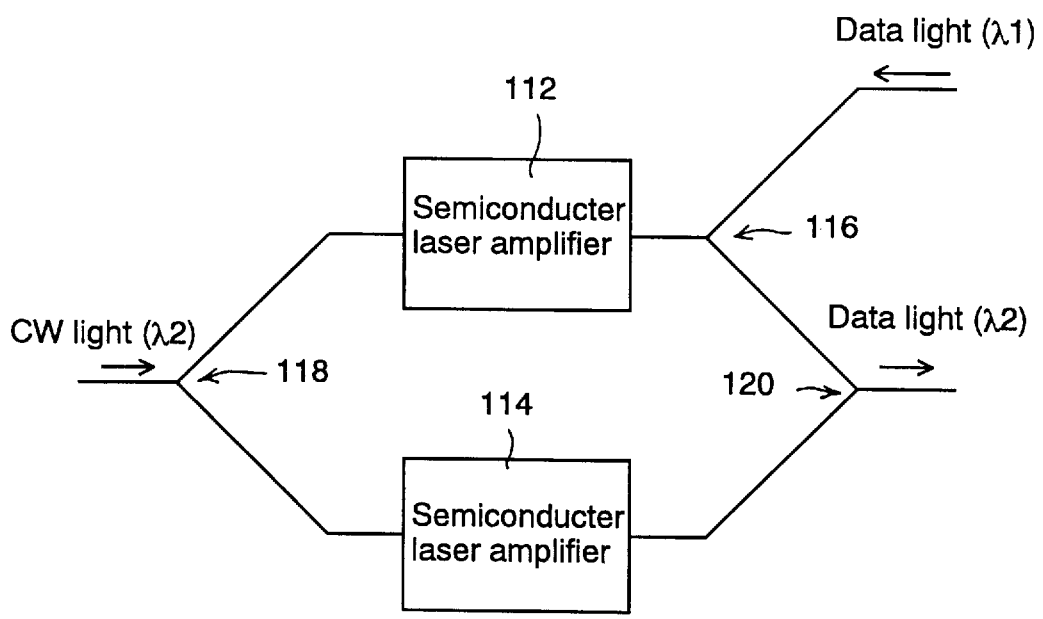
FIG. 12 is a diagram for schematically explaining a prior wavelength converter using mutual phase modulation characteristics of semiconductor laser amplifiers.
Figure 13:
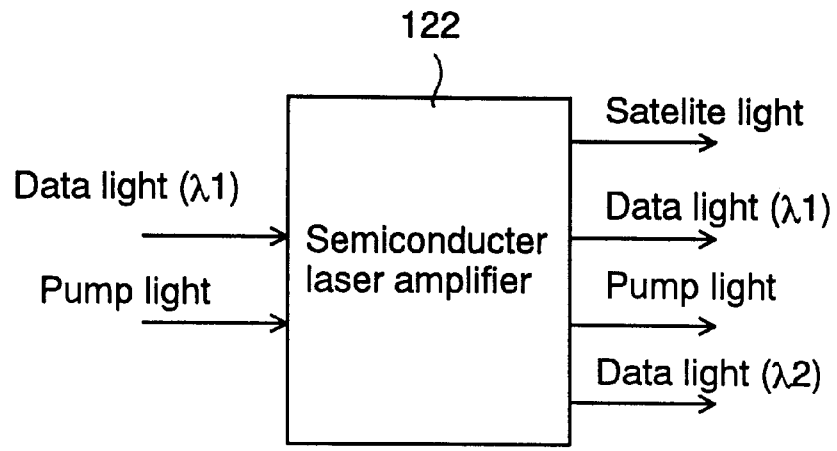
FIG. 13 is a diagram for schematically explaining an prior wavelength converter using four-photon mixing of a semiconductor laser amplifier.
Figure 14:
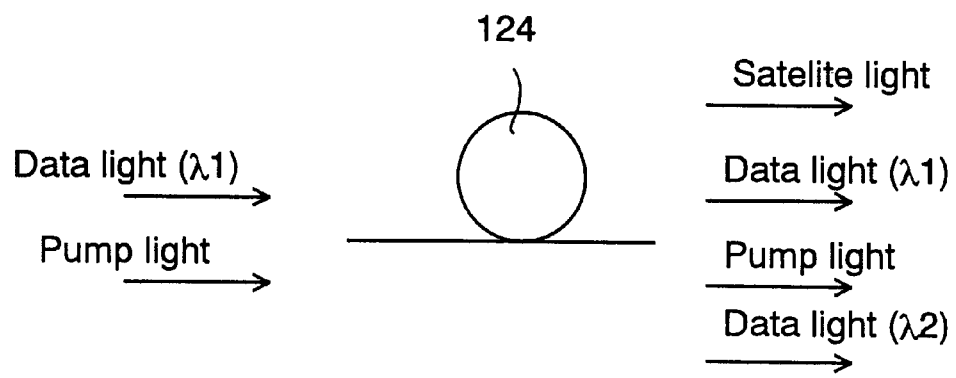
FIG. 14 is a diagram for schematically explaining an prior wavelength converter using four-photon mixing of optical fibers.

As shown in FIG. 10, for example, used as the probe light 12 is RZ-modulated light in the frequency corresponding to one half the clock frequency f0 of the original signal light 16 (that is f1=f0/2), and used as the voltage applied to the optical modulator 10 is a sinusoidal voltage of the frequency (f0/2). Of course, the applied voltage of the optical modulator 10 is in synchronism with the frequency f0/2 of the probe light 12. The applied voltage of the optical modulator 10 is controlled to be low voltage when the intensity of the probe light 12 is a high level. Thus, the waveform of the wavelength-converted light 18 results in a form obtained by sampling the original signal light 16 in the half frequency thereof and largely suppressing the noise light.

Apparently, the function of suppressing noise by changing the applied voltage to the optical modulator 10 in synchronism with the modulation frequency of the probe light 12 can be effective also when f1=f0 (FIG. 6). Although this embodiment uses a sinusoidal wave as the applied voltage, any desired modulated waveform, such as cosine-square waveform or RZ pulse waveform, may be superposed or added to the applied voltage in order to obtain a desired effect.

As understood from the explanation made with reference to FIGS. 5 through 10, the embodiment can realize not only wavelength conversion but also waveform shaping and noise suppression. The embodiment is also applicable to cross-connected optical systems.

As easily understood from the above explanation, according to the invention, wavelength is converted and the large extinction ratio is obtained, using very simple construction. Basically, by optimizing the voltage applied to the absorptive optical modulator, an extinction ratio larger than that of the original signal light can be obtained. Since the invention need not control the plane of polarization, the construction becomes very simple.

Moreover, since it is possible to control the waveform of the wavelength-converted light, remove noise, and remove optical phase distortion contained in the original signal light by using the probe light or the applied voltage to the absorptive optical modulator, the invention promises effective improvements in signal quality.

As a result, the invention can realize economical, high-performance wavelength converters, waveform converters and optical PLL circuits, and can greatly contribute to developments of optical transmission systems.

We claim:

1. A wavelength converter comprising an absorptive optical modulator having absorption characteristics which vary with an applied voltage, said absorptive optical modulator being adapted to receive an original signal light input and a probe light input having at least one wavelength different from a wavelength of the original signal light input, and using the probe light input as a probe light output, said probe light output having information from the original signal light input.

2. A wavelength converter according to claim 1 further comprising optical directional coupling means for coupling said original signal light input to said absorptive optical modulator and for extracting said probe light output from said absorptive optical modulator.

3. The wavelength-converter according to claim 2 further comprising optically amplifying means between said optical directional coupling means and said absorptive optical modulator for amplifying said probe light output from said absorptive optical modulator.

4. The wavelength converter according to claim 1 further comprising temperature adjusting means for adjusting the temperature of said absorptive optical modulator.

5. The wavelength converter according to claim 1 wherein said applied voltage to said absorptive optical modulator comprises a d.c. voltage.

6. A wavelength converter according to claim 1 wherein said applied voltage to said absorptive optical modulator comprises a signal superposed thereon.

7. The wavelength converter according to claim 1 wherein said applied voltage to said absorptive optical modulator comprises a signal with a same frequency as a clock frequency of said original signal light input.

8. The wavelength converter according to claim 1 wherein said probe light input is CW light.

9. The wavelength converter according to claim 1 wherein said probe light input comprises repetitive modulated light.

10. The wavelength converter according to claim 1 wherein said probe light input comprises data-modulated light.

11. The wavelength converter according to claim 9 or 10 wherein said applied voltage to said absorptive optical modulator comprises a signal component having a same frequency as a clock frequency of said probe light.

12. An optical-operational device comprising a light absorptive element having absorption characteristics which vary with incident light and applied voltage, said light absorptive element being adapted to receive an original signal light input and a probe light input which passes through said light absorptive element to form a probe light output, said probe light output having a waveform corresponding to an operation between the original signal light input, said probe light input, and said applied voltage.

13. The optical-operational device according to claim 12 further comprising optical directional coupling means for coupling said original signal light input to said light absorptive element and for extracting said probe light output from said light absorptive element.

14. The optical operational device according to claim 13 further comprising optically amplifying means between said optical directional coupling means and said light absorptive element for amplifying said probe light output.

15. The optical operational device according to one of claims 12 to 14 wherein said light absorptive element comprises an electroabsorption optical modulator.

16. The optical operational device according to claim 15 wherein said applied voltage to said light absorptive element comprises a d.c. voltage.

17. The optical operational device according to claim 15 wherein said applied voltage to said light absorptive element comprises a signal having a same frequency as a clock frequency of said original signal light.

18. The optical operational device according to claim 12 wherein said probe light input is repetitive modulated light with a frequency corresponding to a reciprocal of an integer multiple of a clock frequency of said original signal light.

19. The optical operational device according to claim 12 wherein said probe light input has a wavelength different from that of said original signal light.

20. An optical pulse phase detecting circuit for detecting the optical pulse phase of signal light, comprising:
 a laser light source for generating probe light;
 an electroabsorption medium for changing an intensity of said probe light in accordance with an intensity of said signal light; and
 photodetective means for detecting said intensity changed probe light from said electroabsorption medium.

* * * * *